United States Patent [19]

Olmstead et al.

[11] 4,253,105
[45] Feb. 24, 1981

[54] SEMICONDUCTOR POWER DEVICE INCORPORATING A SCHOTTKY BARRIER DIODE BETWEEN BASE AND EMITTER OF A PNP DEVICE

[75] Inventors: John A. Olmstead, Somerville, N.J.; Sebastian W. Kessler, Jr., San Mateo, Calif.

[73] Assignee: RCA Corporation, New York, N.Y.

[21] Appl. No.: 165,760

[22] Filed: Jul. 3, 1980

[51] Int. Cl.³ .......................................... H01L 29/48
[52] U.S. Cl. ...................................... 357/15; 357/20; 357/36; 357/56; 357/34
[58] Field of Search ................ 357/15, 20, 36, 56, 357/34

[56] References Cited

U.S. PATENT DOCUMENTS

| | | | |
|---|---|---|---|
| 3,358,197 | 12/1967 | Scarlett | 357/34 |
| 3,649,883 | 3/1972 | Augustine | 357/15 |
| 3,740,621 | 6/1973 | Carley | 357/36 |
| 3,836,995 | 9/1974 | Wheatley et al. | 357/34 |
| 3,909,837 | 9/1975 | Kronlage | 357/15 |
| 3,936,863 | 2/1976 | Olmstead | 357/36 |
| 3,943,554 | 3/1976 | Russell et al. | 357/15 |
| 4,017,882 | 4/1977 | Kannam et al. | 357/34 |

FOREIGN PATENT DOCUMENTS

2423114  11/1974  Fed. Rep. of Germany ............ 357/15

OTHER PUBLICATIONS

V. Gani et al., "Bilevel Dual Impedance Monolithic Structure," IBM Tech. Discl. Bull. vol. 18#5, Oct. 1975, pp. 1407–1408.

*Primary Examiner*—Joseph E. Clawson, Jr.
*Attorney, Agent, or Firm*—Birgit E. Morris; Donald S. Cohen; Kenneth R. Glick

[57] ABSTRACT

A semiconductor power device comprises a semiconductor pellet having first and second opposing major surfaces, including, in series, emitter, base and collector regions forming a PNP transistor. The collector region is substantially planar and adjacent to the second surface; the base region is adjacent to the collector region and extends to the first surface; and the emitter region extends into the pellet from the first surface such that it is substantially surrounded by the base region. The emitter region substantially surrounds a substantially centrally located extension of the base region which also terminates at the first surface. Emitter, base and collector electrodes are ohmically disposed on the respective semiconductor regions and a Schottky barrier contact is formed on the base region extension, the Schottky contact being connected to the emitter electrode.

13 Claims, 5 Drawing Figures

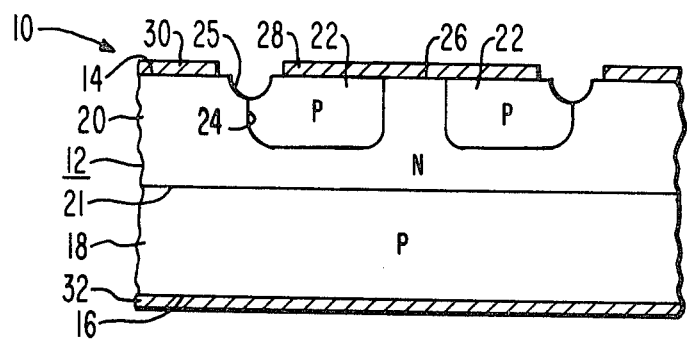
Fig. 1.
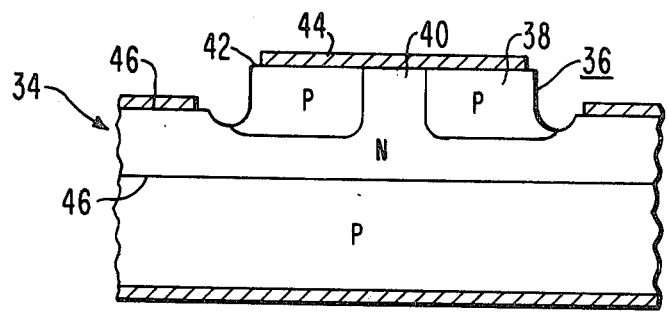
Fig. 2.
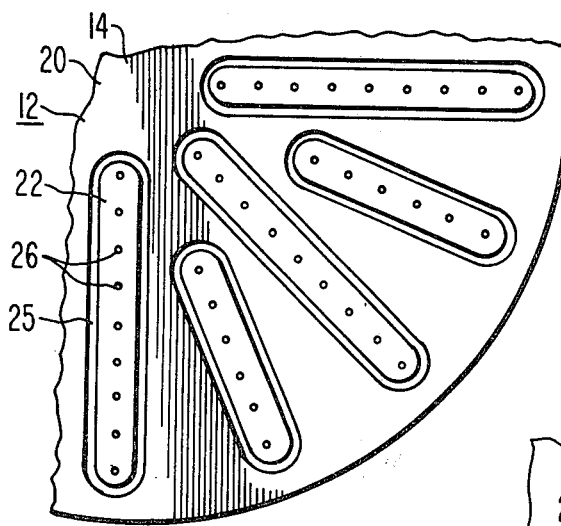
Fig. 4.
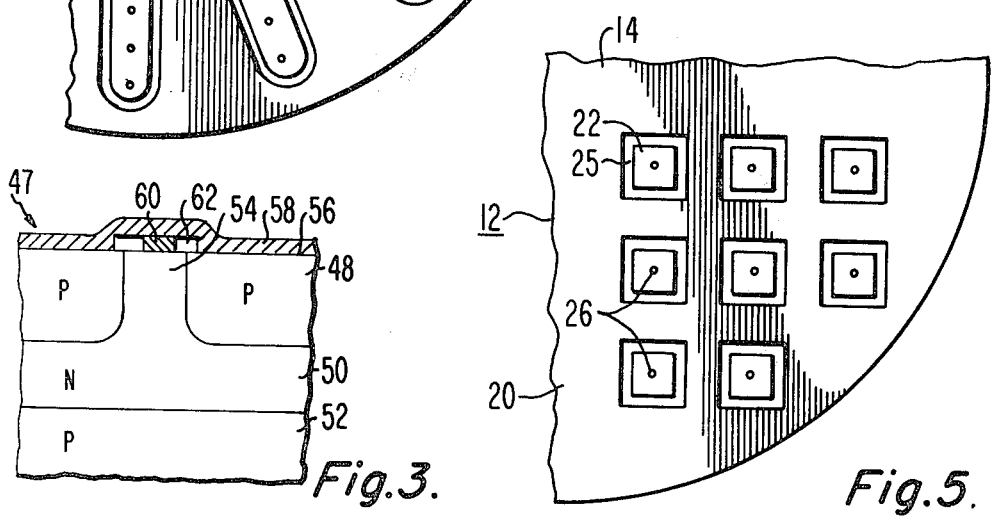
Fig. 3.
Fig. 5.

SEMICONDUCTOR POWER DEVICE INCORPORATING A SCHOTTKY BARRIER DIODE BETWEEN BASE AND EMITTER OF A PNP DEVICE

BACKGROUND OF THE INVENTION

This invention relates to semiconductor devices used in high power switching applications. More specifically, it relates to bipolar power transistors such as those used in transcalent devices.

Bipolar transistors operated at high power densities are subject to a failure mode termed second breakdown. This breakdown is characterized by a sudden decrease in emitter-collector voltage and a simultaneous increase in emitter current, such that unless the power is rapidly removed, the device will be destroyed or significantly degraded by overheating. Second breakdown is caused by current concentrations in local areas of the emitter/base junction creating local overheating. Once a localized hot spot occurs, positive thermal feedback begins; the hot region injects more, thereby getting hotter, thereby injecting more. If the available power is limited, the peak temperature remains below a critical value. However, if the peak temperature reaches a value such that local base-collector leakage current reaches base current magnitude, the device regenerates into second breakdown.

Second breakdown can occur during either forward or reverse bias and typically initiates at a central portion of the emitter/base junction area. Various forms of series resistance emitter ballasting and base ballasting have been suggested in an effort to reduct hot spot formation, although emitter ballasting is only partially effective in protecting against reverse bias second breakdown. Shorting the base to the emitter through a resistance is another known technique for generally improving second breakdown characteristics of power transistors. However, this technique, known as shunt ballasting, is not wholly satisfactory because the base region typically has a relatively low resistivity, thereby permitting an excessive base shunt current which degrades the transistor current gain (hFE).

The present invention discloses a novel structure which provides forward and reverse second breakdown protection in a PNP power transistor, with no significant degradation in current gain.

SUMMARY OF THE INVENTION

A semiconductor power device includes a semiconductor pellet having first and second opposing major surfaces and emitter, base and collector regions arranged in series so as to form a PNP transistor. The collector region is substantially planar and is adjacent to the second surface. The base region is adjacent to the collector region and extends to the first surface. The emitter region extends into the pellet from either the first surface or a mesa on the first surface and it is substantially surrounded by the base region. The emitter region substantially surrounds a substantially centrally located extension of the base region which terminates at the first surface (or the surface of the mesa). Emitter, base and collector electrodes are in ohmic contact with their respective semiconductor regions, and a Schottky barrier contact is disposed on the base region extension, the Schottky contact being connected to the emitter electrode.

BRIEF DESCRIPTION OF THE DRAWINGS

FIG. 1 is a cross-sectional view of a semiconductor device incorporating the present invention.

FIG. 2 is a cross-sectional view of the present invention in an alternate embodiment.

FIG. 3 is a cross-sectional view of an alternate electrode structure of the present invention.

FIG. 4 is a top view of an alternate embodiment of the present invention.

FIG. 5 is a top view of another alternate embodiment of the present invention.

DETAILED DESCRIPTION

FIG. 1 is a cross-sectional view of the present invention embodied in a power transistor 10. The transistor 10 comprises a semiconductor pellet 12 having first and second opposing major surfaces, 14 and 16 respectively. The pellet 12 includes a substantially planar collector region 18, of first conductivity type, which terminates at the second surface 16 and a base region 20, of second conductivity type, disposed across the collector and extending to the first surface 14. A PN junction 21 is formed at the collector/base interface. An emitter region 22 extends into the pellet 12 from the first surface 14, forming an emitter/base PN junction 24. In the preferred embodiment, a moat 25 adjacently surrounds the emitter region such that the PN junction 24 terminates at the moat. However, although the moat 25 can enhance device performance, it is not necessary to the invention.

It should be noted that the transistor 10 illustrated in FIG. 1 incorporates a single emitter region 22. The base region 20 has a portion 26 which extends to the first surface 14 within the boundaries of the emitter region 22, FIG. 1 representing a cross-sectional view taken through this base region extension 26. In an ideal embodiment, the base region extension 26 would be of substantially columnar shape.

Optimally, the base region extension 26 is centrally located in the emitter region 22, and moreover, the emitter region can contain a plurality of centrally located base region extensions. For example, the emitter region 22 can have a finger-like shape at the first surface 14 and a plurality of base extensions 26 disposed along the long axis of the finger, extending into the pellet from the first surface.

In a preferred embodiment, an emitter electrode 28 overlies the emitter region 22 and base region extension 26 on the first surface 14. The emitter electrode 28 is disposed such that it forms an ohmic contact with the emitter region 22 and a Schottky barrier contact with the base region extension 26. A base electrode 30 contacts the bulk of the base region, for example, at the first pellet surface 14 and a collector electrode 32 contacts the collector region, for example, at the second pellet surface 16.

An alternate embodiment of a power transistor incorporating the present invention is illustrated in FIG. 2 and is generally designated as 34. Power transistor 34 is substantially similar in structure and function to the power transistor 10 such that the internal structure of transistor 34 need not be described in detail. The primary distinction between the two devices is the presence of a mesa 36 protruding from the first surface 37 of transistor 34. Preferably, the mesa 36 has a surface 42 which is substantially parallel to the first major surface 14, although the mesa surface may be curved as well.

The internal structure of the mesa 36 is essentially a continuation of the emitter region 38 and the base region extension 40, both of which terminate at the mesa surface 42. The emitter electrode 44 is disposed on the mesa surface 42 such that if forms an ohmic contact with the emitter region 38 and a Schottky barrier contact with the base region extension 40.

FIG. 3 illustrates an alternate electrode structure 47 applicable to either transistor 10 or transistor 34. The illustration represents a portion of the previously described devices, having similarly structured emitter 48, base 50 and collector 52 regions. The emitter region 48 and base region extension 54 terminate at a semiconductor surface 56, wherein the surface 56 represents either the first pellet surface 14 of transistor 10 or the mesa surface 42 of transistor 34. On the surface 56, an insulating material 62 such as silicon oxide defines an area of the base region extension 54, and a Schottky barrier electrode 60 is disposed in this area. An emitter electrode 58 ohmically contacts the emitter region 48 and the Schottky electrode 60. In this configuration the emitter electrode 58 is a substantially continuous layer which overlies the emitter region 48, the insulating material 62, and the Schottky electrode 60.

Although the structures illustrated in FIGS. 1, 2 and 3 represent functional devices, the transistors 10 and 34 can also be incorporated into larger devices. For example, a larger device can include a plurality of portions, each having the sectional view of transistor 10 or 34. FIG. 4 illustrates a first surface 14 view (electrodes not shown) of one such configuration of transistor 10. In this exemplary embodiment, (also applicable to transistor 34), a plurality of finger-like emitter regions 22 are radially disposed on the surface of a semiconductor pellet 12. Each emitter region 22 includes a plurality of base region extensions 26 and is separated from the surrounding base region 20 by a moat 25. It should be recognized, that this embodiment, described with reference to transistor 10, is also applicable to transistor 34, wherein the device would include a plurality of radially disposed finger-like mesas 36. Additionally, the alternate electrode structure 47, illustrated in FIG. 3, can be incorporated into the embodiment of FIG. 4.

FIG. 5 illustrates another exemplary embodiment for transistor 10 or transistor 34, although it too has been identified with reference to the semiconductor regions of transistor 10. In this configuration, an array of substantially rectangular emitter regions 22 is disposed on the first surface 14 of the pellet 12, each emitter region 22 being separated from the surrounding base region 20 by a moat 25. A base region extension 26 extends into the pellet 12 from substantially the center of each emitter region 22. For clarity, neither the Schottky barrier contact to the base region extension 26 nor the ohmic emitter electrode are shown in FIG. 5. Either the electrode structure described with reference to FIGS. 1 and 2, or the alternate electrode structure 47 described with reference to FIG. 3 can be incorporated into this embodiment. Additionally, it should be recognized that although the array of emitter regions 23 is illustrated as being uniform, it is not required that the spacings between neighboring emitter regions be equal.

Further elaboration of transcalent device configurations can be obtained with reference to U.S. Pat. No. 4,126,879, Semiconductor Device With A Ballast Resistor Adapted For A Transcalent Device, S. W. Kessler, Jr. et al, Nov. 21, 1978 and U.S. Pat. No. 3,739,235, Transcalent Semiconductor Device, S. W. Kessler, Jr., June 12, 1973.

Devices of the present invention can be formed by methods commonly known in the semiconductor industry. For example, transistor 10 can be fabricated by standard single, double or triple diffusion techniques and transistor 34 can be fabricated utilizing a conventional epitaxial base and collector process. The base region extensions 26 and 40 can be formed during standard processing, for example, by photolithographically generating mask areas on a semiconductor surface followed by diffusing relatively deep emitter regions into that surface.

For a device designed to handle more than approximately 100 watts, typical emitter finger dimensions on the first surface of the transistor 10 are 0.006–0.010 in. (152–254$\mu$) by 0.2–0.9 in. (5.1–22.9 mm). The pellet is typically approximately 0.008 in. (200$\mu$) thick, the base region might extend to a depth of approximately 0.001–0.002 in. (25–51$\mu$) from the first surface, and the emitter region might extend into the pellet approximately 0.0008 in. (20$\mu$) from the first surface. The moat might be 0.0005 in. (13$\mu$) deep and 0.001–0.002 in. (25–51$\mu$) wide.

In transistor 10, the resistivity of the N type base will typically vary from approximately 0.02 ohm-centimeters at that portion of the base extension near the pellet surface to approximately 0.5 ohm-centimeters at that portion near the base/collector junction 21. An effective configuration of the base region extension(s) 26 would include a plurality of equally spaced dots along the long axis of the emitter region on the first pellet surface. At the first surface, spacing between these base region extension dots should be approximately equal to the width of the emitter finger. Preferably, in the described device, a plurality of such emitter fingers are radially disposed on the first surface of the pellet such that there is sufficient emitter area to handle the design current.

A device incorporating mesas, transistor 34, would have a substantially similar design as transistor 10. The essential distinction is a reduction in the total pellet thickness and the depth of the base/collector junction 46 from the first surface 37. The base/collector junction 46 in transistor 34 can be spaced from the mesa surface 42 the same distance that the base/collector junction 21 of transistor 10 is spaced from the first pellet surface 14. The depth of the emitter region(s) 38 (and base region extension(s) 40), measured from the mesa surface 42, is equivalent to the depth of the emitter region 22, measured from the first surface 14 of transistor 10.

For transistor 10 or 34, of FIG. 1 or 2, the corresponding emitter electrode 28 or 44 must be formed so as to create a Schottky barrier contact with the base region extension 26 or 40, and an ohmic contact to the surrounding emitter region 22 or 38. This can be accomplished, for example, utilizing an emitter electrode 28 or 44 which includes a nickel, platinum, tungsten or palladium layer deposited on the semiconductor surface 14 or 42. The conventional deposition of nickel, platinum, tungsten or palladium onto a nonregeneratively doped N type base (present in either embodiment) creates a Schottky barrier contact. This same deposition can be used to simultaneously create an ohmic contact to the P type emitter regions 22 or 48 (which is typically of high conductivity) if so desired.

The alternate electrode structure 47 illustrated in FIG. 3 can also be conventionally formed. For example, an insulating material 62 can be generated and photolithographically defined on the surface 56 so as to delineate an area of the base region extension 54 on which the Schottky electrode 60 is to be formed. The Schottky electrode can then be formed in the delineated area by depositing nickel, platinum, tungsten, palladium, or other Schottky contact material. Any excessive insulating material can then be removed from the surface of the emitter region 48, followed by the formation of the emitter electrode 58. Thus, in this alternate electrode structure 47 it is not required that the emitter electrode 58 itself form a Schottky contact to the base region extension 54 on the semiconductor surface. It need only ohmically contact the Schottky electrode 60. Therefore, in this structure 47, the emitter electrode 58 can be aluminum, sequentially deposited chromium, titanium, gold, or any other conventionally deposited ohmic contact material.

High power switching applications require a device which is capable of switching more than approximately 100 watts. In conventional power transistors, reverse bias second breakdown may occur when collector current continues to flow during emitter/base reverse bias conditions, such as when a transistor operating with an inductive load is turned off. When the emitter/base junction is reverse biased, the edge of the emitter region (near the base electrode at the semiconductor pellet surface) is more rapidly turned off than the emitter center (in the interior of the pellet). The center of the emitter is thus more susceptible to hot spot formation, current hogging, thermal runaway and initiation of second breakdown.

Devices of the present invention are less susceptible to second breakdown because the Schottky barrier contact to the base region discourages runaway injection and hot spot formation. The diode characteristic of the Schottky contact is such that emitter-base injection will not be significantly diminished under normal forward biased operating conditions. Additionally, when devices of the present invention are reverse biased, the base region extensions provide paths for any charge carriers stored in the base region to travel to the Schottky contact and the emitter electrode. The central portion of the emitter region will thus be turned off more rapidly than it would be in a conventional device. Furthermore, when the Schottky contact gets hot, it will conduct more current. This will reduce the emitter/base junction bias and further tend to shut the device off in the center of the emitter region.

The present invention thus provides a novel configuration for a power transistor, producing enhanced second breakdown protection without degrading current gain at normal power levels.

We claim:

1. A semiconductor power device, comprising:
   a semiconductor pellet having first and second opposing major surfaces and including, in series, emitter, base and collector regions forming a PNP transistor;
   the collector region being substantially planar and adjacent to the second surface;
   the base region adjacent to the collector region and extending to the first surface;
   the emitter region extending into the pellet from the first surface and being substantially surrounded by the base region; the emitter region substantially surrounding a substantially centrally located extension of the base region which extends to the first surface;
   an emitter electrode contacting the emitter region;
   an electrode forming a Schottky barrier contact to the base region extension on the first surface, said Schottky contact being connected to the emitter electrode;
   a collector electrode contacting the collector region; and
   a base electrode contacting the base region.

2. A device in accordance with claim 1, wherein the emitter electrode is a substantially continuous layer on the first semiconductor surface, forming an ohmic contact to the emitter region and a Schottky barrier contact to the base region extension.

3. A device in accordance with claim 1, further comprising:
   a mesa protruding from the first surface and having a mesa surface, said mesa essentially being an extension of the emitter region and the base region extension; and
   the emitter electrode and Schottky barrier contact on said mesa surface.

4. A device in accordance with claim 3, wherein the emitter electrode is a substantially continuous layer on the mesa surface, forming an ohmic contact to the emitter region and a Schottky barrier contact to the base region extension.

5. A device in accordance with claims 1 or 3, wherein a Schottky barrier contact electrode is delineated on the surface of the base region extension by insulating material.

6. A device in accordance with claim 5, wherein the emitter electrode overlies the Schottky barrier contact electrode and said insulating material.

7. A device in accordance with claims 1 or 3, wherein the emitter region has a substantially rectangular shape.

8. A device in accordance with claim 7, further comprising an array of said emitter regions.

9. A device in accordance with claims 1 or 3, further comprising a plurality of base region extensions forming a plurality of Schottky contacts.

10. A device in accordance with claim 9, wherein the base region extensions are located along a first surface center line of the emitter region.

11. A device in accordance with claims 1 or 3, wherein the pellet includes a moat at the periphery of the emitter region at the first surface.

12. A device in accordance with claims 1 or 3, wherein the emitter region has a finger-like shape.

13. A device in accordance with claim 12, comprising a plurality of finger-like emitter regions radially disposed at the first pellet surface.

* * * * *